United States Patent [19]

Rastogi et al.

[11] Patent Number: 5,747,879
[45] Date of Patent: May 5, 1998

[54] INTERFACE BETWEEN TITANIUM AND ALUMINUM-ALLOY IN METAL STACK FOR INTEGRATED CIRCUIT

[75] Inventors: Rajiv Rastogi, Portland, Oreg.; Sandra J. Underwood, Albuquerque, N. Mex.; Harry H. Fujimoto, Sunnyvale, Calif.

[73] Assignee: Intel Corporation, Santa Clara, Calif.

[21] Appl. No.: 672,413

[22] Filed: Jun. 28, 1996

Related U.S. Application Data

[62] Division of Ser. No. 536,238, Sep. 29, 1995, abandoned.

[51] Int. Cl.$^6$ .................... H01L 23/48; H01L 29/40; H01L 23/52; H01L 29/12
[52] U.S. Cl. .................... 257/751; 257/752; 257/763; 257/765; 257/767; 257/915; 257/771
[58] Field of Search .................... 257/751, 752, 257/763, 764, 765, 767, 750, 915, 771

[56] References Cited

U.S. PATENT DOCUMENTS

| | | | |
|---|---|---|---|
| 4,702,967 | 10/1987 | Black et al. | 428/620 |
| 4,714,686 | 12/1987 | Sander et al. | 437/195 |
| 5,202,579 | 4/1993 | Fujii et al. | 257/751 |
| 5,231,053 | 7/1993 | Bost et al. | 437/190 |
| 5,240,880 | 8/1993 | Hindman et al. | 437/190 |
| 5,286,676 | 2/1994 | Kruger et al. | 437/190 |
| 5,300,813 | 4/1994 | Joshi et al. | 252/752 |
| 5,345,108 | 9/1994 | Kikkawa | 257/751 |
| 5,427,666 | 6/1995 | Mueller et al. | 204/192 |
| 5,470,790 | 11/1995 | Myers et al. | 437/192 |

FOREIGN PATENT DOCUMENTS

| | | |
|---|---|---|
| 0 598 422 A1 | 6/1993 | European Pat. Off. . |
| 0-658-926-A1 | 9/1994 | European Pat. Off. . |
| 63-33647 | 6/1963 | Japan . |
| 2-122546 | 10/1990 | Japan . |
| 3-120357 | 5/1991 | Japan . |
| 3-292729 | 12/1991 | Japan . |
| 6-151425 | 5/1994 | Japan . |

OTHER PUBLICATIONS

Wendt et al.: Process Integration for Barrier Layers and Al–Alloys using a Sputtering cluster Tool, Microelectronic Engineering 19 (1992) 371–74 Elsevier no month.

*Primary Examiner*—Teresa M. Arroyo
*Attorney, Agent, or Firm*—Blakely, Sokoloff, Taylor & Zafman

[57] ABSTRACT

An improvement in a metal stack used for interconnecting structures in an integrated circuit. The improvement comprises the entrapping in a titanium layer of nitrogen at the interface where the titanium layer contacts a bulk conductor layer such as an aluminum-copper alloy layer. The entrapped nitrogen prevents the formation of any substantial amount of titanium aluminide thereby reducing current densities and also improving the electromigration properties of the stack. As currently preferred, the nitrogen is entrapped in approximately the first 30Å of the titanium layer.

9 Claims, 6 Drawing Sheets

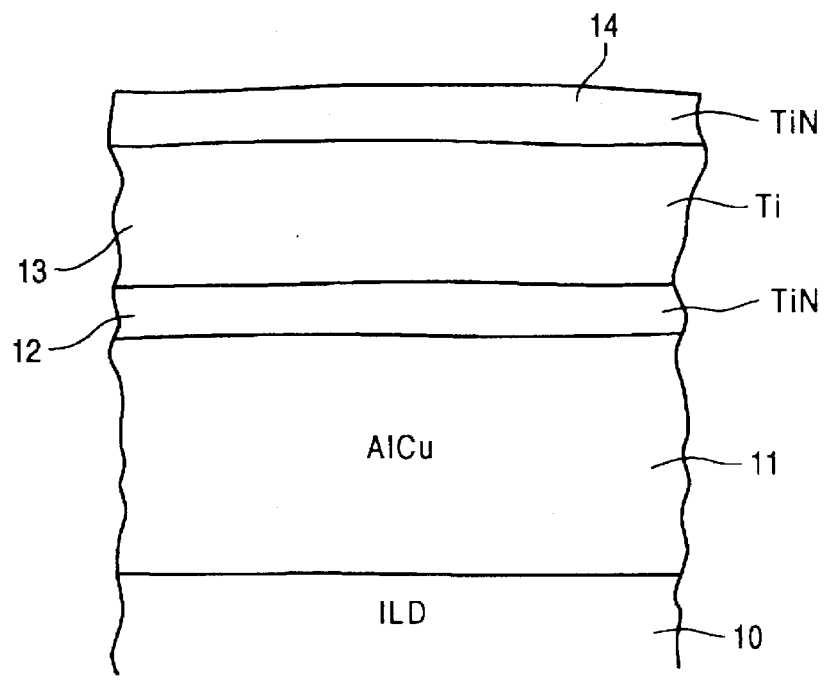
FIG_1 (PRIOR ART)
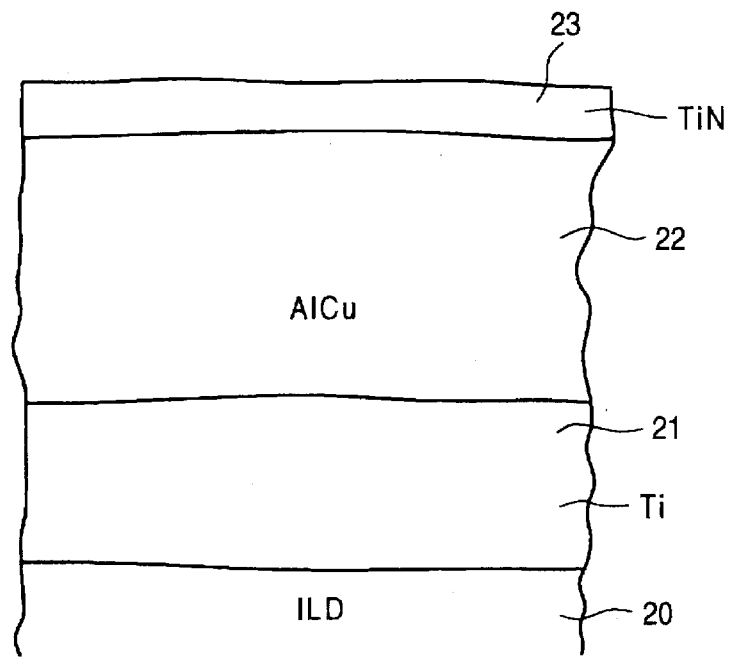
FIG_2 (PRIOR ART)

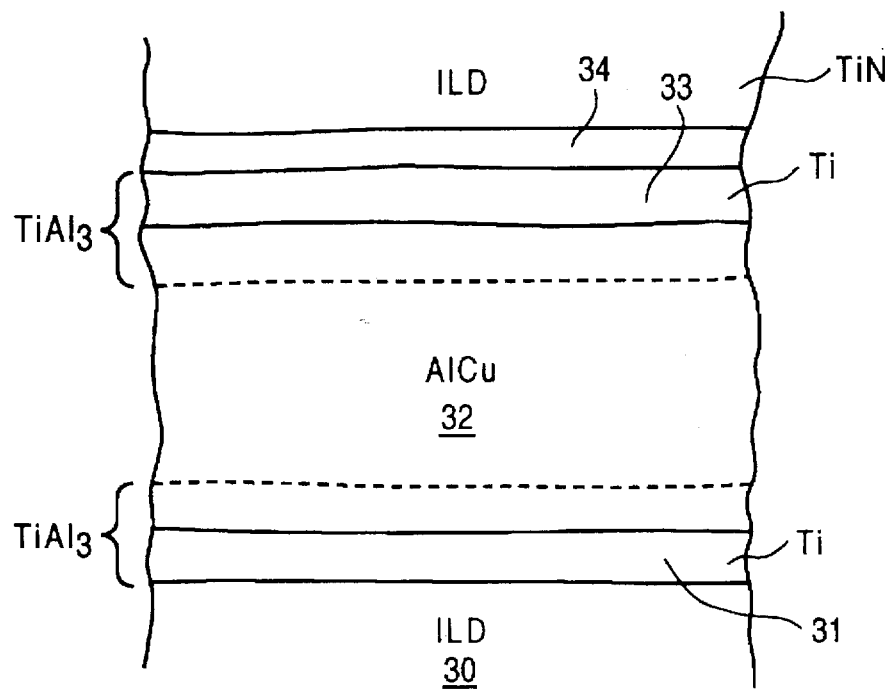
FIG_3
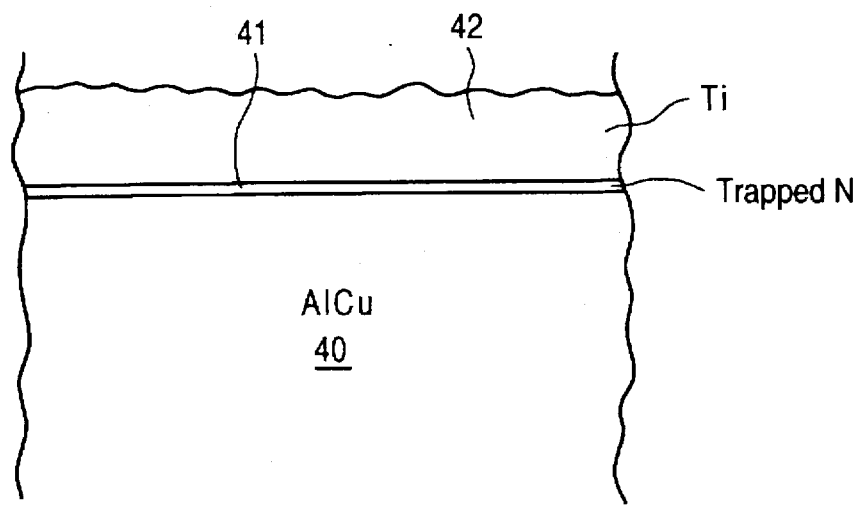
FIG_4

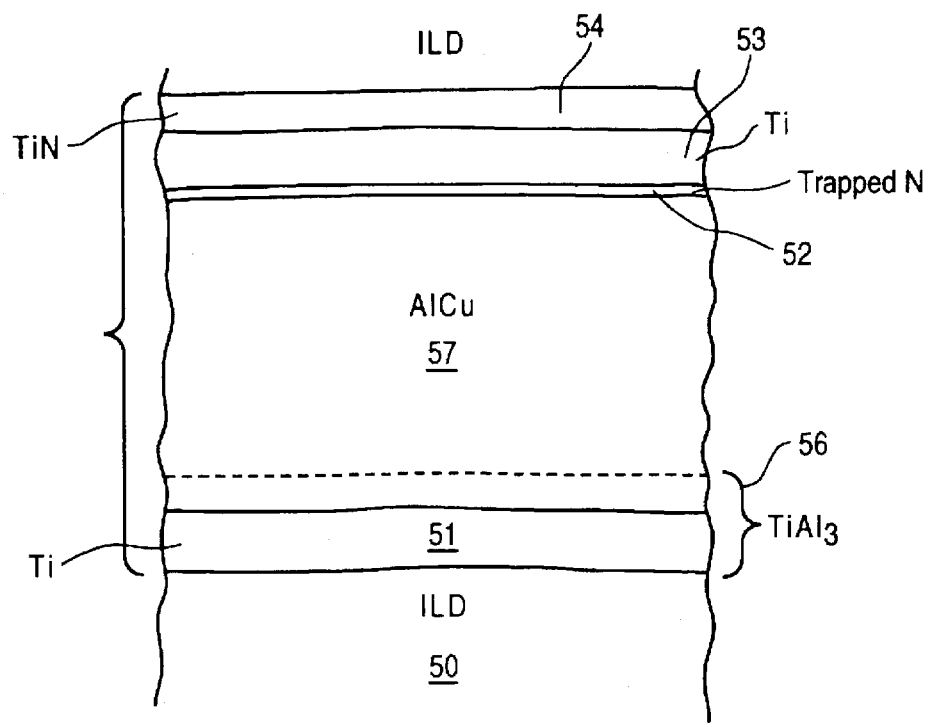
FIG_5
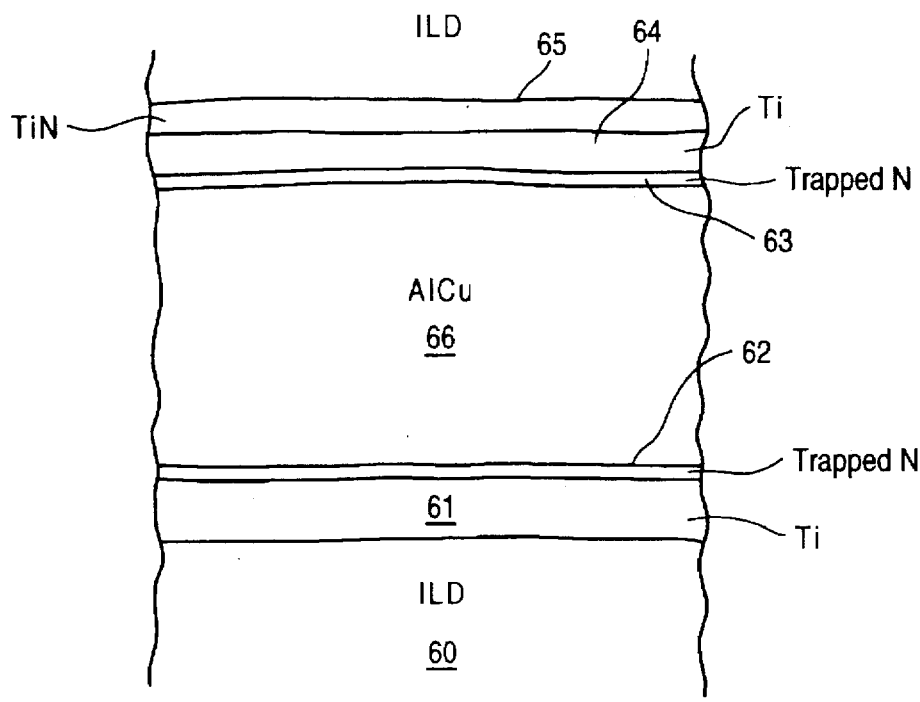
FIG_6

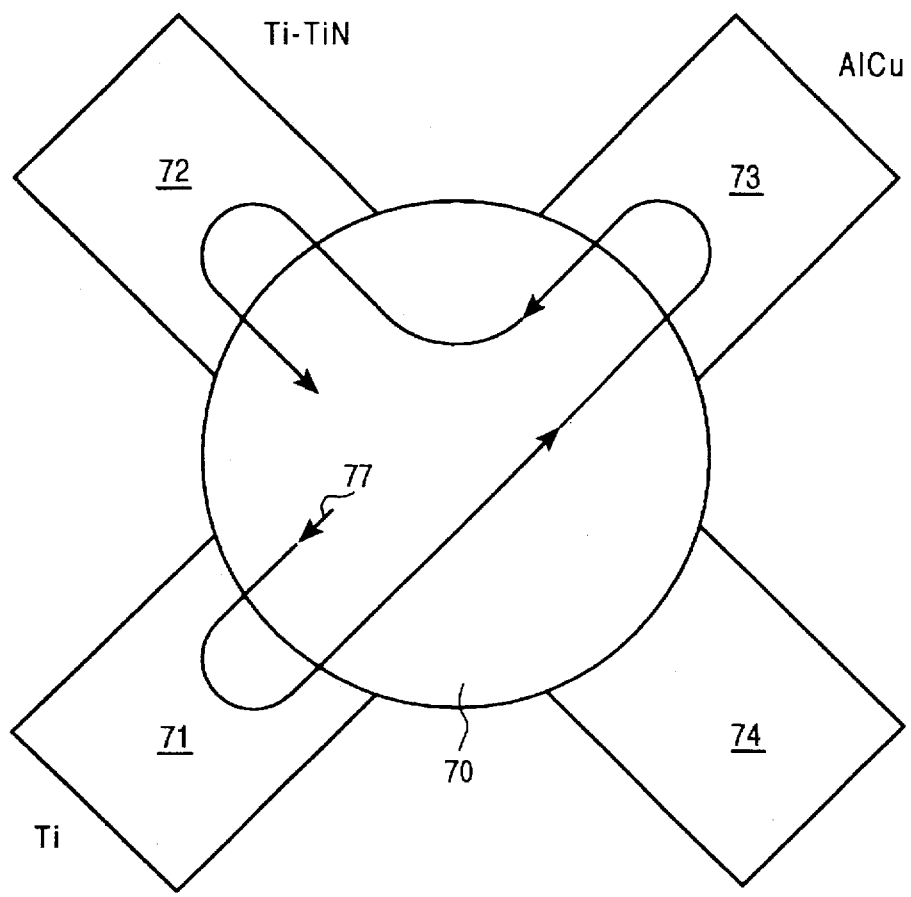
FIG_7
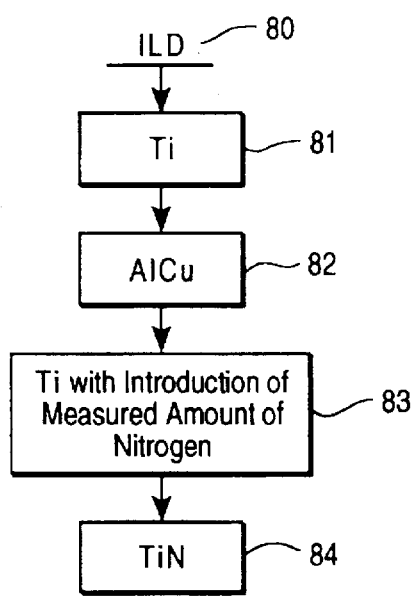
FIG_8

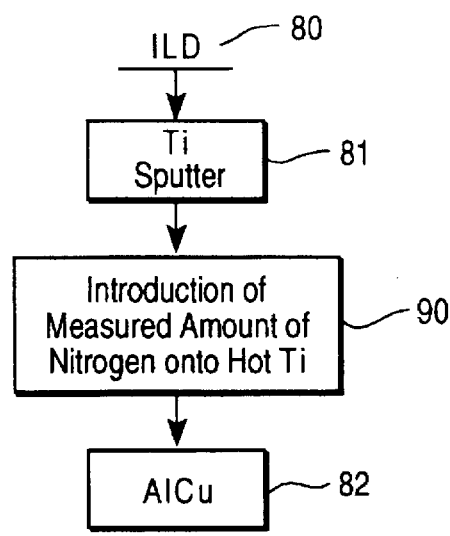
FIG_9
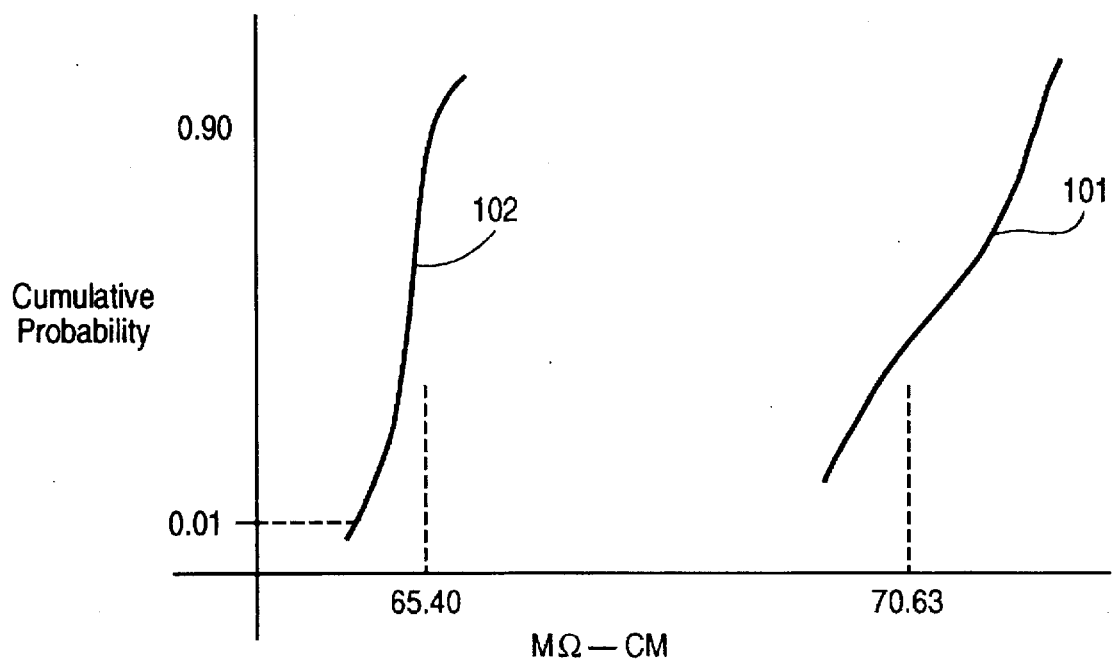
FIG_11

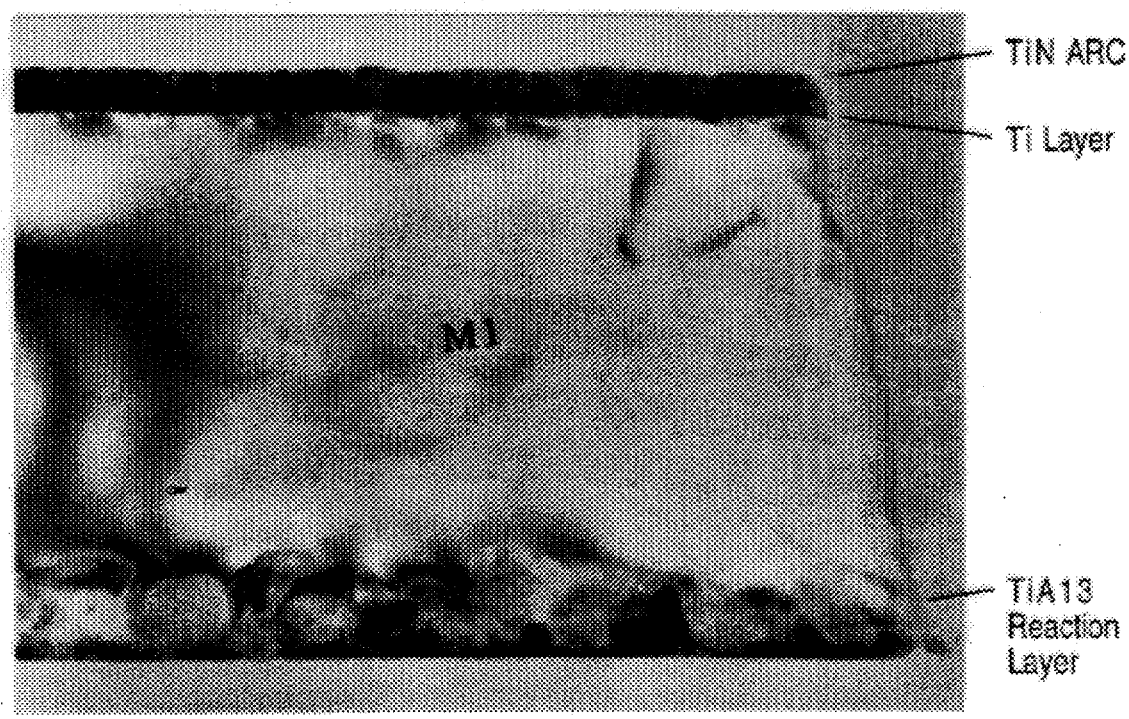
FIG_10

INTERFACE BETWEEN TITANIUM AND ALUMINUM-ALLOY IN METAL STACK FOR INTEGRATED CIRCUIT

This is a divisional of application Ser. No. 08/536,238, filed Sep. 29, 1995 now abandoned.

BACKGROUND OF THE INVENTION

1. Field of the Invention

The invention relates to metal stacks used for interconnecting structures in integrated circuits.

2. Related Applications

This application is related to co-pending application Ser. No. 327,763, filed Oct. 17, 1994, entitled "A Novel Via Hole Profile and Method of Fabrication", and co-pending application Ser. No. 08/868,022, filed Jun. 3, 1997, which is a continuation of Ser. No. 08/536,155, filed Sep. 29, 1995, now abandoned entitled "Metal Stack for Integrated Circuit Having Two Thin Layers Of Titanium With Dedicated Chamber Depositions", Docket No. 42390.P3172—both applications are assigned to the Assignee of the present application.

DESCRIPTION OF THE PRIOR ART

Modern integrated circuits often include millions of active and passive devices such as transistors, capacitors and resistors formed on a semiconductor substrate such as silicon. These devices, when initially fabricated, are isolated from one another on the substrate and are later interconnected to form functional circuits. The quality of these interconnecting structure drastically affects the performance and the reliability of the completed integrated circuit. Interconnections are increasingly determining the limits of performance and densities in modem ultra large scale integrated (ULSI) circuits.

Often the interconnecting structure is fabricated from a metal stack which may include a base layer, bulk conductor layer and/or capping layer. The stack is formed on a dielectric layer generally by sputtering and then through use of photolithographic techniques is etched to define the interconnecting structure. In current production processes, multiple levels of interconnecting structures are used, for example, four layers of metal stacks may be used, each insulated from one another by a interlayer dielectric (ILD). More often than not, aluminum and aluminum alloys are used as the bulk conductor in metal stacks.

Electromigration is a significant reliability problem for these thin-film conductors. Aluminum, due to its low melting point, is more susceptible to electromigration than are other metals. As high currents pass through a conductor, atoms are transported and vacancies are generated at grain boundaries which coalesce into a network of voids. Void nucleation often occurs at the intersection of grain boundaries and conductor sidewalls. In aluminum-copper alloys selected boundaries remain intact, presumably where they are hardened by copper-rich planar precipitates, resulting in voids with several sharply defined edges. These variously shaped voids continue to enlarge until an open circuit terminates the process.

Refractory metals are often used in conjunction with aluminum alloys to provide shunting layers, that is, an electrical path even in the presence of these voids. As will be discussed in connection with FIGS. 1 and 2, titanium and titanium nitride layers are sometimes used as shunting layers.

FIG. 1 shows one prior art metal stack used for an interconnecting structure. In FIG. 1 the metal stack is formed on an interlayer dielectric (ILD) 10. The bulk conductor 11 comprises an aluminum-copper alloy layer 11. The thickness of this layer varies depending upon the current that the layer is required to carry; a typical layer may be 3500Å thick. A layer of titanium nitride (TiN) is formed on the upper surface of the layer 11. This layer in the prior art stack described in FIG. 1 is approximately 370Å thick. Then a layer 13 of titanium approximately 1000Å thick is sputtered on to the upper surface of layer 12. Following this an anti-reflective coating (ARC) 14 comprising titanium nitride is formed on the upper surface of layer 13. This coating is 370Å thick for the prior art example shown in FIG. 1.

FIG. 2 shows another prior art metal stack used for an interconnecting structure which is formed on an ILD 20. First, a base layer 21 of titanium approximately 1000Å thick is formed on the ILD 20. Following this the bulk conductor, again an aluminum-copper alloy layer 22 is formed on the upper surface of titanium layer 21. The thickness of this layer is, as before, determined by the amount of current that the layer is required to carry (e.g., 6000Å to 12000Å thick). An ARC 23 is formed on the upper surface of layer 22. Again layer 23 comprises a coating of TiN 370Å thick.

As will be seen the present invention provides a different stack than those shown in FIGS. 1 and 2. The newly disclosed metal stack has been found to have superior qualities and, in particular, improved electromigration performance over the metal stacks shown in FIGS. 1 and 2.

SUMMARY OF THE INVENTION

The present invention is for use in an interconnecting structure in an integrated circuit where a metal stack is used having a titanium layer in contact with a bulk conductor layer such as an aluminum-copper alloy layer. Nitrogen is introduced into the initial formation of the titanium layer such that an ultra thin region (e.g., 30Å) entrapping nitrogen is formed between the bulk conductor layer and the titanium layer. The remainder of the titanium layer is then formed without the presence of nitrogen. The entrapped nitrogen minimizes the formation of titanium aluminide ($TiAl_3$). This has three advantages:

(A) Reduction in $TiAl_3$ formation results in greater thickness of AlCu available to carry current, thereby leading to lower current density in the metal interconnect lines. This improves electromigration performance.

(B) Reduction in $TiAl_3$ formation reduces void formation in the bulk AlCu film. Formation of $TiAl_3$ is closely linked to voiding of the AlCu bulk film and thereby reduced electromigration performance.

(C) Reduction in $TiAl_3$ formation results in lower line resistance since the bulk resistivity of bulk AlCu is 2.98 micro ohm-cm and that of $TiAl_3$ is 16.98 micro ohm-cm.

BRIEF DESCRIPTION OF THE DRAWINGS

FIG. 1 is a cross sectional elevation view of a prior art metal stack used for an interconnecting structure in an integrated circuit.

FIG. 2 is a cross sectional elevation view of a prior art metal stack used for an interconnecting structure in an integrated circuit.

FIG. 3 is a cross sectional elevation view of a metal stack suitable for using the improvement of the present invention.

FIG. 4 is a cross sectional elevation view of an interface between two metal layers showing the improvement of the present invention.

FIG. 5 is a cross sectional elevation view of the metal stack of FIG. 3 with the improvement of the present invention.

FIG. 6 is an alternate embodiment of the stack of FIG. 5 where the improvement of the present invention is used at two interfaces.

FIG. 7 is a plan view of a sputter system useful in fabricating the metal stacks of the present invention.

FIG. 8 is a process flow diagram illustrating the steps used to fabricate the metal stack of the present invention.

FIG. 9 is an alternate process flow diagram illustrating the additional step needed to fabricate the embodiment of FIG. 6.

FIG. 10 is a TEM micrograph for the metal stack of FIG. 5.

FIG. 11 is a graph illustrating the improvement of the present invention when compared to the metal stack of FIG. 3.

DETAILED DESCRIPTION OF THE INVENTION

The present invention describes a novel metal stack for use as an interconnecting structure in an integrated circuit. In the following description numerous specific details are set forth, such as specific materials, processes and equipment in order to provide a thorough understanding of the present invention. It will be apparent, however, to one skilled in the art that the present invention may be practiced without these specific details. In other instances, well-known manufacturing materials, processes and equipment are not set forth in detail in order not to unnecessarily obscure the present invention.

The Metal Stack of FIG. 3

The metal stack of FIG. 3 is used to illustrate a stack on which the present invention may be used. This stack includes a base layer 31 of titanium which is sputtered onto the ILD 30. While titanium is preferred, other refractory metals may be used for this thin layer. This shunting layer may be approximately between 125Å and 200Å thick, although 185Å is preferred.

A bulk conductor layer 32 which, in one embodiment, uses an aluminum-copper alloy having approximately 0.5% copper is in contact with the upper surface of the base layer 31. Although an aluminum alloy layer is preferred because of its low resistivity and its well-known processes, it is to be appreciated that other low resistance materials may act as the bulk conductor. The thickness of the layer 32 is selected as a function of the amount of current that the layer 32 will carry. Typical values for the thickness of layer 32 range between approximately 5000Å to 20,000Å thick.

A thin capping layer 33 of titanium is formed in contact with the upper surface of the layer 32. Layer 33 is sputtered titanium, preferably approximately 185Å thick in the preferred embodiment. However, this layer may be approximately between 125Å to 200Å thick. Again, as in the case of layer 31 other refractory materials may be used for layer 33.

Finally, an anti-reflective coating (ARC) 34 is formed on the upper surface of the layer 33. This layer of titanium nitride (TiN) is approximately 150Å thick. As is well-known this layer reduces reflections which would otherwise make masking of the metal stack more difficult.

As may be noted from FIG. 3 there are two interfaces in the stack between aluminum alloy and titanium. Once such interface is between layers 31 and 32 and the other between layers 32 and 33. When titanium and aluminum are sufficiently heated, a reaction occurs to form titanium aluminide (TiAl$_3$). Without the improvement of the present invention a complete reaction occurs between the titanium layers and the bulk conductor forming titanium aluminide layers at these interfaces as shown in FIG. 3. This occurs with high temperature processing after formation of the metal stacks such as ILD deposition, ILD annealing, high temperature ash cleaning steps and other steps. Although the original thickness of the titanium layers 31 and 33 are each approximately 185Å in the currently preferred embodiment, 185Å of Ti will react with 525Å of AlCu alloy and result in the formation of approximately 670Å of the TiAl$_3$ layer. A more complete description of the metal stack of FIG. 3 and its fabrication can be found in co-pending application Ser. No. 08/868,022, Jun. 3, 1997, filed, entitled "Metal Stack for Integrated Circuit Having Two Thin Layers of Titanium with Dedicated Chamber Depositions" assigned to the Assignee of the present invention.

The titanium aluminide reaction decreases the volume of the reacted materials by approximately 7% in some cases and hence, will increase the stress in the metal stack. This stress contributes to the creation of stress voiding and accelerates electromigration failures. As will be seen, the present invention minimizes the titanium aluminide reaction and consequently reduces the stress thereby increasing the lifetime and reliability of the resulting interconnecting structure. Additionally, the aluminum-copper alloy bulk conductor layer remain thicker since it is not consumed in the reaction thereby providing a reduced current density.

The Improvement of the Present Invention

FIG. 4 illustrates the improvement of the present invention which comprises the formation of an ultra thin region of titanium containing entrapped nitrogen at the interface between the aluminum-copper alloy bulk conductor and titanium layers. Specifically, as shown in FIG. 4 the bulk conductor layer 40 does not directly contact the titanium layer 42 but rather, the ultra thin region 41 with the trapped nitrogen is disposed between these two layers. The formation of this layer is described later in this application. In the currently preferred embodiment this region is approximately 30Å thick. This ultra thin region of trapped nitrogen substantially inhibits the formation of the titanium aluminide and consequently prevents the decrease in the volume of the aluminum-copper alloy layer 40. This improvement will be seen graphically in conjunction with FIG. 10.

The Embodiments of the Present Invention of FIGS. 5 and 6

In FIG. 5 the metal stack of FIG. 3 is illustrated with the improvement of the present invention used at one of the interfaces between the bulk conductor and the titanium layer. The metal stack is formed on an ILD 50 and includes a base layer 51 of 185Å of titanium. The bulk conductor layer 57 of aluminum-copper alloy is formed on the upper surface of the base layer 51. With the improvement of the present invention, an ultra thin region 52 of titanium with entrapped nitrogen is formed in the titanium layer 53 at the interface with the bulk conductor layer 57. As mentioned, this region in the currently preferred embodiment, is approximately 30Å thick. The ARC 54 comprising approximately 150Å of titanium nitride is formed on the capping layer 53.

For the embodiment of FIG. 4, when subsequent high temperature processing occurs the base layer 51 reacts with the layer 57 to form the titanium aluminide as shown by the layer 56. However, at the other titanium/aluminum interface, no significant amount of titanium aluminide is formed because of the barrier created by the entrapped nitrogen.

In the embodiment of FIG. 6 an ultra thin titanium region entrapping nitrogen is formed at both interfaces between the bulk conductor and titanium layers. Referring to FIG. 6, a metal stack is formed on an ILD 60 and includes the 185Å thick base layer 61 of titanium. The ultra thin region 62 of entrapped nitrogen (approximately 30Å thick) is formed on the upper surface of the base layer 61. Then the aluminum-copper alloy, bulk conductor layer 66 is sputtered on to layer 62. Following this another ultra thin region 63 of titanium with entrapped nitrogen approximately 30Å thick is formed on the upper surface of the bulk conductor layer 66 as part of the approximately 185Å of titanium in the capping layer. Finally, the ARC 65 of titanium nitride is formed on the titanium layer 64.

Thus, as can be seen from FIG. 6, since the ultra thin regions of entrapped nitrogen are used at both interfaces between titanium and the aluminum-copper alloy, during subsequent high temperature processing substantially no titanium aluminide is formed.

Fabrication of the Metal Stack of the Present Invention

FIGS. 7 and 8 are used to describe the fabrication of the metal stack shown in FIG. 5. This stack is fabricated using a commercially available cluster sputtering apparatus such as an AMAT 5500, Endura Sputter System. Such systems include, as shown in FIG. 7, a central region 70 equipped with a robotic arm allowing wafers to be moved from one chamber to another, such as between chambers 71, 72, 73 and 74. Each of the chambers are separately controllable to allow different processing to occur in each of the chambers.

For the formation of the stack of the present invention a wafer having an exposed ILD is transported as shown at 77 into the chamber 71. In chamber 71 the base layer of titanium (e.g., 185Å) is sputtered on to the ILD. This step is shown in FIG. 8 as step 81 and follows the processing for the ILD, step 80. Following this, the wafer is moved to the chamber 73 where the bulk conductor such as aluminum-copper alloy, is sputtered on the base layer of titanium. This is shown in FIG. 8 by the processing step 82.

Now the wafer is moved to chamber 72 where the capping layer with its entrapped nitrogen is formed. This may be done by flowing nitrogen into the chamber 72 while the target is hot, prior to the commencement of the sputtering of the titanium. No additional nitrogen is used during the sputtering of the 185Å thick titanium layer.

Following the sputtering of the titanium capping layer in the chamber 72 the same chamber is used to form the titanium nitride ARC. The transition from the deposition from titanium to titanium nitride films is done by extinguishing the plasma after Ti deposition, establishing desired gas flows for the TiN film and then turning on the plasma for the TiN film deposition. Nitrogen gas is introduced at 10 sccm flow for one second and then is turned off. Argon gas is introduced at 70 sccm for five second. With argon gas flowing at 70 sccm, plasma is ignited at 1.5 kilowatts of power for about 11.5 seconds. This completes deposition of 185Å Ti. Next with plasma off, gas flows are adjusted to the following for 10 seconds: Argon gas—15 sccm; Nitrogen gas—100 sccm. Now the plasma is turned on for approximately 11 seconds at 6.5 kilowatts of power at the following gas flows: Argon gas—15 sccm; Nitrogen gas—80 sccm. This completes the deposition of 150Å of TiN.

After TiN ARC formation there is some residual nitrogen left in the chamber 72, but in order to ensure a repeatable and manufacturable process, nitrogen gas should be introduced just prior to the Ti deposition. This should be done for every wafer or else there will be a significant variation in the films produced on a wafer-to-wafer basis. This introduction of a controlled amount of nitrogen just before striking the plasma for the Ti deposition also ensures that each wafer processed through the sputter system will be exactly the same no matter how long the delay between processing of two or more wafers. This process not only improves the electromigration performance of the process but also ensures that it is a reliably manufacturable process.

This processing is shown by step 83 of FIG. 8 where a measured amount of nitrogen is introduced into the chamber to form the ultra thin entrapping region. Following the formation of the capping layer the titanium nitride ARC as shown by step 84 is formed in the same chamber without removal of the wafer and, as mentioned, by extinguishing the plasma, establishing the desired gas flow and then by striking the plasma again for TiN formation.

As is apparent, there is a reduction in defects associated with sequential Ti/TiN in chamber 72 for both the capping layer and the ARC. Additionally, there is an improvement in run rate due to the sequential deposition of the Ti/TiN films in the same chamber.

FIG. 9 shows the additional processing required to obtain the improvements of the present invention for the interface between the base layer and the bulk conductor layer. In FIG. 9 the ILD formation step 80 is again shown as is the formation of the titanium base layer-step 81. For the processing step shown in FIG. 9, instead of immediately beginning the sputtering of the aluminum-copper alloy layer as shown by step 82, an additional step 90 is used. The step provides the ultra thin region 62 of FIG. 6. The ultra thin layer may be formed by leaking nitrogen on to the hot titanium layer in the same chamber in which the base layer is formed at the end of the sputtering of this titanium layer. Following the formation of the base layer as shown by step 82 the bulk conductor layer is formed.

Advantages of the Present Invention

The micrograph of FIG. 10 corresponds to the embodiment of the present invention shown in FIG. 5. The bulk conductor is shown as "M1". As can be seen in the lower portion of the figure, the $TiAl_3$ has reacted with the bulk conductor thereby reducing the volume of the bulk conductor. In contrast, at the upper part of the figure no reaction has occurred between the titanium layer and the bulk conductor. This is due to the entrapped nitrogen at the interface between the titanium layer and the bulk conductor layer. As can be readily seen from FIG. 10, essentially none of the aluminum-copper alloy is consumed in the formation of the titanium aluminide because of the entrapped nitrogen.

Finally FIG. 11 shows the measured improvement in resistance between the stack of FIG. 3 represented by the curve 101 and the stack of FIG. 5 represented by the curve 102. As can be seen, there is a decrease in resistance for the stack of FIG. 5 primarily because minimal aluminum was consumed by the Ti capping layer to form $TiAl_3$. More importantly, there is a significant improvement in the electromigration reliability of the metal interconnect in the stack of FIG. 5 when compared to the stack of FIG. 3.

Thus, an improvement in a metal stack has been disclosed where there is a titanium layer interfacing with an aluminum alloy layer. By the entrapment of nitrogen at the interface, the reaction between the titanium and aluminum is sufficiently deterred to eliminate any significant deterioration in performance due to the formation of $TiAl_3$.

We claim:

1. A metal stack for use as an interconnecting structure in an integrated circuit comprising;

a base layer of titanium;

a bulk conductor layer in contact with the base layer; and, a capping layer of titanium in contact with the bulk conductor layer, this region of the capping layer adjacent to the bulk conductor layer including an entrapped layer of nitrogen-disposed between the bulk conductor layer and the capping layer of titanium, the entrapped layer of nitrogen formed without the formation of titanium nitride between the bulk conductor layer and the capping layer of titanium.

2. The metal stack defined by claim 1 including a titanium nitride layer formed over the capping layer on a surface of the capping layer separate from the entrapped layer of nitrogen.

3. The metal stack defined by claims 1 or 2 wherein the base layer is approximately between 125Å and 200Å thick.

4. The metal stack defined by claim 3 wherein the capping layer is approximately between 125Å and 200Å thick.

5. The metal stack defined by claims 1, 2, or 4 wherein the region of the capping layer having the entrapped layer of nitrogen is approximately 30Å thick.

6. The metal stack defined by claim 5 wherein the bulk conductive layer comprises an aluminum-copper alloy.

7. The metal stack defined by claim 1 including a region of trapped nitrogen disposed between the base layer and the bulk conductor layer, the region of trapped nitrogen formed without the formation of titanium nitride between the base layer and the bulk conductor layer.

8. The metal stack defined by claim 7 wherein the region of trapped nitrogen disposed between the base layer and the bulk conductor layer is approximately 30Å thick.

9. The metal stack defined by claim 8 wherein the base and capping layers are each approximately between 125Å and 200Å thick.

* * * * *

UNITED STATES PATENT AND TRADEMARK OFFICE
CERTIFICATE OF CORRECTION

PATENT NO. : 5,747,879
DATED : May 5, 1998
INVENTOR(S) : Rastogi et al.

It is certified that error appears in the above-identified patent and that said Letters Patent is hereby corrected as shown below:

ON the title page item [54] and column 1 line 1;

delete "FOR INTEGRATED CIRCUIT"
and insert --WITH SEQUENTIAL TITANIUM/TITANIUM NITRIDE DEPOSITION--

Signed and Sealed this

Eighth Day of September, 1998

Attest:

BRUCE LEHMAN

Attesting Officer

Commissioner of Patents and Trademarks